(12) United States Patent
An et al.

(10) Patent No.: US 12,160,070 B1
(45) Date of Patent: Dec. 3, 2024

(54) SAFETY LATCH MECHANISM ENFORCING PROPER DISCONNECT SEQUENCE

(71) Applicant: ZT Group Int'l, Inc., Secaucus, NJ (US)

(72) Inventors: Chen An, Secaucus, NJ (US); Mahesh Kumar Varrey, Secaucus, NJ (US); Zichun Song, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 363 days.

(21) Appl. No.: 17/831,819

(22) Filed: Jun. 3, 2022

(51) Int. Cl.
| H01R 13/64 | (2006.01) |
| H01R 13/627 | (2006.01) |
| H01R 13/641 | (2006.01) |

(52) U.S. Cl.
CPC ....... H01R 13/641 (2013.01); H01R 13/6273 (2013.01)

(58) Field of Classification Search
None
See application file for complete search history.

(56) References Cited

U.S. PATENT DOCUMENTS 12,026,021 B1 * 7/2024 Trotta ................... G06F 1/187

* cited by examiner

*Primary Examiner* — Ross N Gushi
(74) *Attorney, Agent, or Firm* — Dergosits & Noah LLP; Todd A. Noah

(57) ABSTRACT

An apparatus is provided for forcing a service technician to follow a proper servicing sequence that reduces the potential for an electric shock. Embodiments of the latch mechanism maintain a cable connection unless a tray connector is first disconnected. Embodiments enforce the disconnect sequence using a trigger that is actuated by the disconnecting of the tray connector, a latch-lock in the cable connector that is biased to block a cable connector disconnect mechanism, and a mechanical link between the trigger and the latch-lock. The actuation of the trigger is transmitted by the mechanical link to the latch-lock, which moves in response, unlocking the cable connector and allowing it to be disconnected.

16 Claims, 14 Drawing Sheets

SAFETY LATCH MECHANISM ENFORCING PROPER DISCONNECT SEQUENCE

BACKGROUND

In one rack mounted system power from a rack power rail is split three ways by a power module distribution unit (PMDU) to connect to backplane connectors for powering three hard disk drive (HDD). For each of the HDD backplane connections, the PMDU uses a prior art PMDU tray 25, as shown in FIG. 4, to connect power from the rack power rail to the backplane connector. PMDU tray 25 generally includes a cable connector 18, a cable chain 22, and a PMDU tray connector 38. Cable connector 18 includes a guide section 34 that cooperates with a guide block associated with the backplane connector to line up a cable electrical connector 32 with the associated backplane electrical connector. When connected to the backplane connector, cable connector 18 is held connected by heads (52a, 52b (FIG. 6B)) of latch cylinders 20a, 20b being received within notched slots of the backplane guide block. Cable chain 22 provides power through cabling 36 connected by a tray connector 38 located near edge 40 of PMDU tray 25. Tray connector 38 connects to a mating PMDU power connector. The connection between connector 38 and the PMDU power connector is a "blind mate" connection in that connector 18 is first connected to the backplane connector, then the chassis with the three HDDs is installed in the rack above the PMDU power connector (which obscures the backplane connections), and then connector 38 is connected to the PMDU power connector by pushing tray 25 toward the PMDU connector-without the user being able to see connector 38 or the PMDU power connector.

Power to such an HDD may be disconnected in two ways. First, power to the backplane electrical connector may be disconnected by compressing latch cylinders 20a, 20b toward the interior of guide section 34 so that T-shaped heads 52a, 52b move inward and disengage from the latch slots (e.g., slot 16) in the backplane guide block. The neck of the T-shaped head is smaller than the latch slot and, with latch cylinders 20a, 20b compressed, connector 18 may be disconnected from the backplane connector, with the neck of the T-shaped head passing through the notched slot upon the withdrawal of connector 18. Second, power to the HDD may also be disconnected by disconnecting PMDU connector 38 from the mating PMDU power connector.

For safety considerations, it is advisable to disconnect PMDU tray connector 38 first. For example, if cable connector 18 were disconnected first, cable chain 22 would remain connected to the PMDU power connector, and, if cable chain 22 included a damaged, exposed wire, a service technician would be at risk of a severe shock.

FIG. 1 and FIG. 2 illustrate examples of prior art latch pull mechanisms used in, e.g., the auto industry.

Elements discussed in this Background with regard to FIG. 4 may also be found in other drawings. However, such discussion does not mean that the other drawings are prior art.

Thus, what is needed is an apparatus that prevents the disconnecting of the chassis connection before the disconnecting of tray connector 38.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a mechanical safety latch mechanism that enforces a safer disconnect sequence. The embodiments prevent a user from accidentally disconnecting the cable chain connector before first disconnecting the PMDU tray connector. Thus, embodiments force the user to follow a proper servicing sequence that keeps the user from receiving a potential electric shock, which may occur if the cable connector or cable itself is damaged or shorted to their respective housings. In embodiments, the latch mechanism maintains the cable connection to the backplane unless the PMDU tray connector is first disconnected. In embodiments, the disconnect sequence is enforced using a trigger that is actuated by the disconnecting of the PMDU tray connector, a latch-lock in the cable connector that is biased to block a cable connector disconnect mechanism, and a mechanical link between the trigger and the latch-lock. In embodiments, the actuation of the trigger is transmitted by the mechanical link to the latch-lock, which moves in response, unlocking the cable connector disconnect mechanism.

In an embodiment, the trigger is incorporated into the PMDU tray and movement of the tray that is sufficient to disconnect the PMDU connection results in actuation of the trigger. The trigger actuation is transmitted by a flexible cable to the latch-lock, which moves as a result and unblocks the cable connector disconnect mechanism. As a result, when the user moves the PMDU tray and disconnects the PMDU connection, the trigger is activated and the cable connection disconnect mechanism is enabled. The user may then safely disconnect the cable connector.

Figure 2:
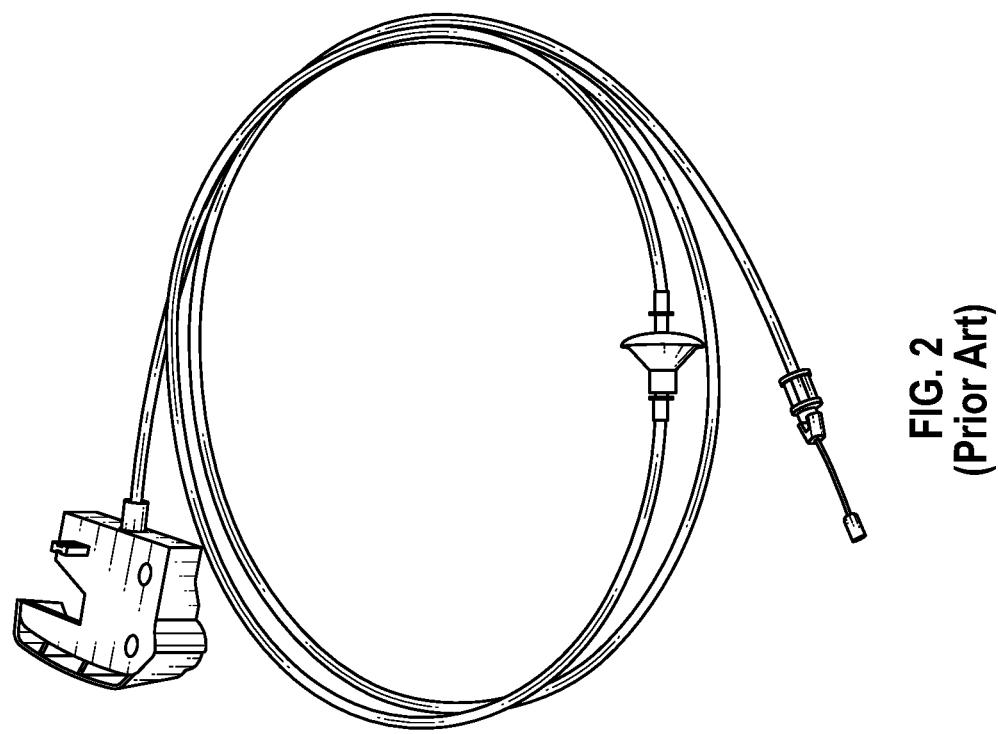
FIG. 2 is prior art and is an isometric view illustrating a latch pull mechanism.
Figure 1:
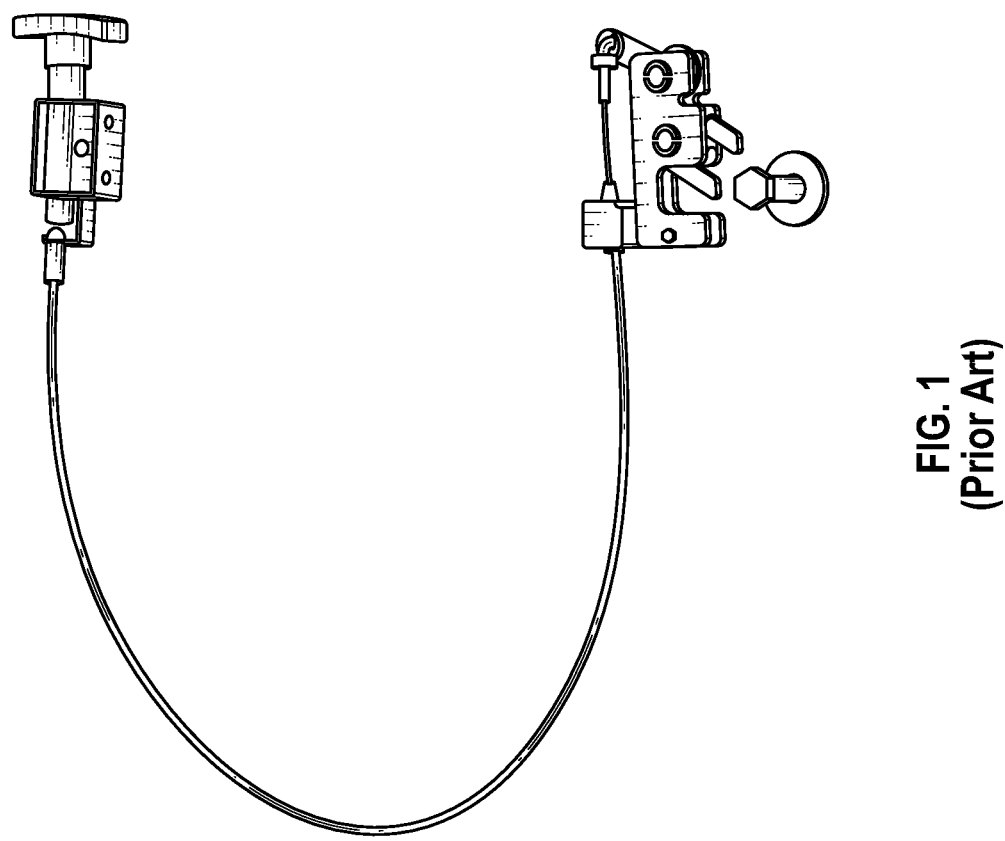
FIG. 1 is prior art and is an isometric view illustrating a latch pull mechanism.
Figure 3B:
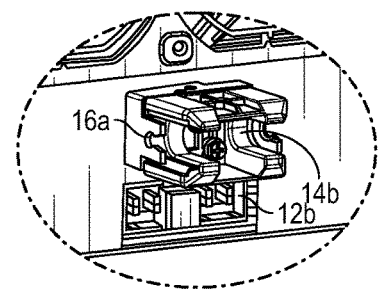
FIG. 3B illustrates a detail from FIG. 3A.
Figure 3A:
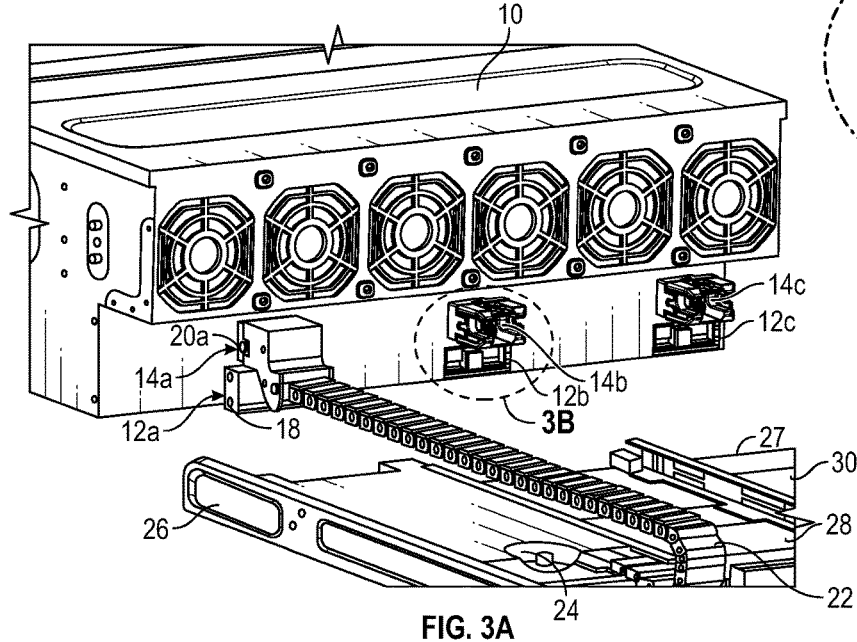
FIG. 3A is an upper left rear isometric view illustrating an embodiment of a latch mechanism enforcing a proper disconnect sequence.

FIG. 3A is an upper left rear isometric view illustrating an embodiment of a latch mechanism enforcing a proper disconnect sequence. In FIG. 3A, a power module distribution unit (PMDU) 24 connects to a chassis 10 with three hard-disk drive (HDD) backplane connections 12a-12c. In FIG. 3A and FIG. 3B, power from a rack power rail 46 (FIG. 5A) is split three ways using three trays 124 within power module distribution unit (PMDU) 24. FIG. 3A illustrates one tray 124 for clarify. PMDU tray 26 includes tray positions 28 and 30 for two additional trays 124 to provide power to connection 12b and 12c, respectively. FIG. 3B illustrates a detail from FIG. 3A.

Figure 4:
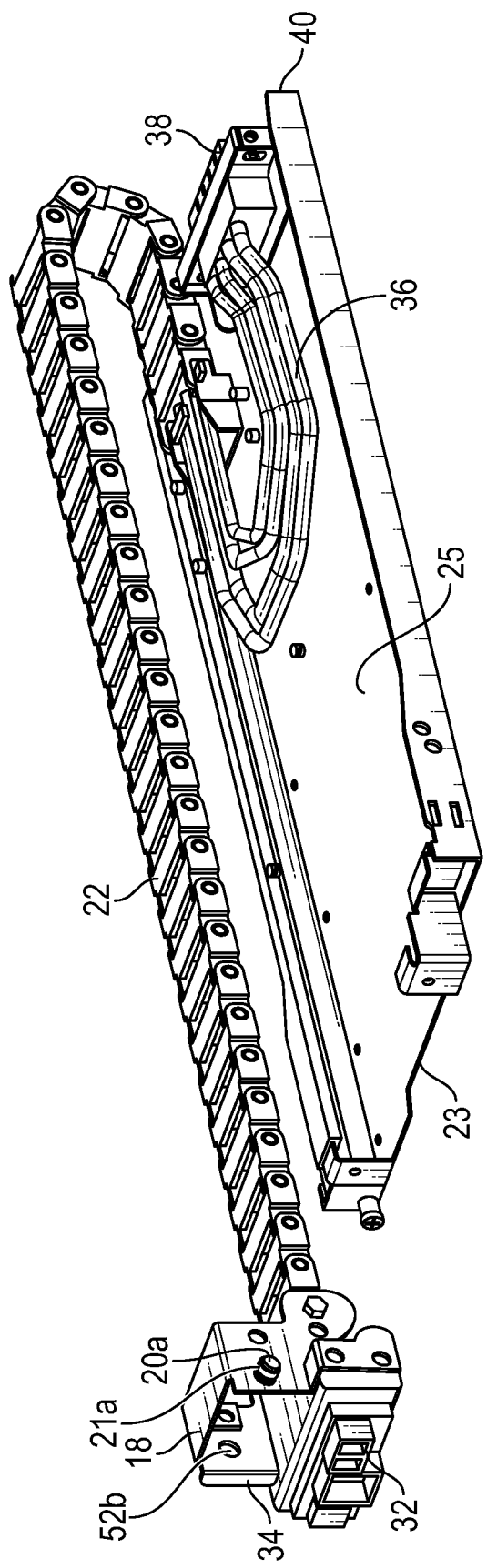
FIG. 4 is an upper left front isometric view illustrating a tray from a PMDU.

In FIG. 3A, HDD backplane chassis connector 12a (12a-12c are similar connectors) may be connected by a cable connector 118 and a cable chain 122 to tray 124 within PMDU 24. Each chassis connector 12a-12c includes a guide block 14a, 14b, 14c, respectively, to facilitate making and maintaining a proper connection between a cable connector and the chassis connector. Each chassis block 14a, 14b, 14c, is provided with a notched slot (e.g., 16b, FIG. 3B) on each side of the block for receiving a latch cylinder 20a, 20b (FIG. 4). FIG. 3B illustrates that each guide block 14a-14c has been further provided with large slots 70a. 70b to accept a slider 110 (FIG. 5A, FIG. 6A) of cable connector 118.

Figure 5A:
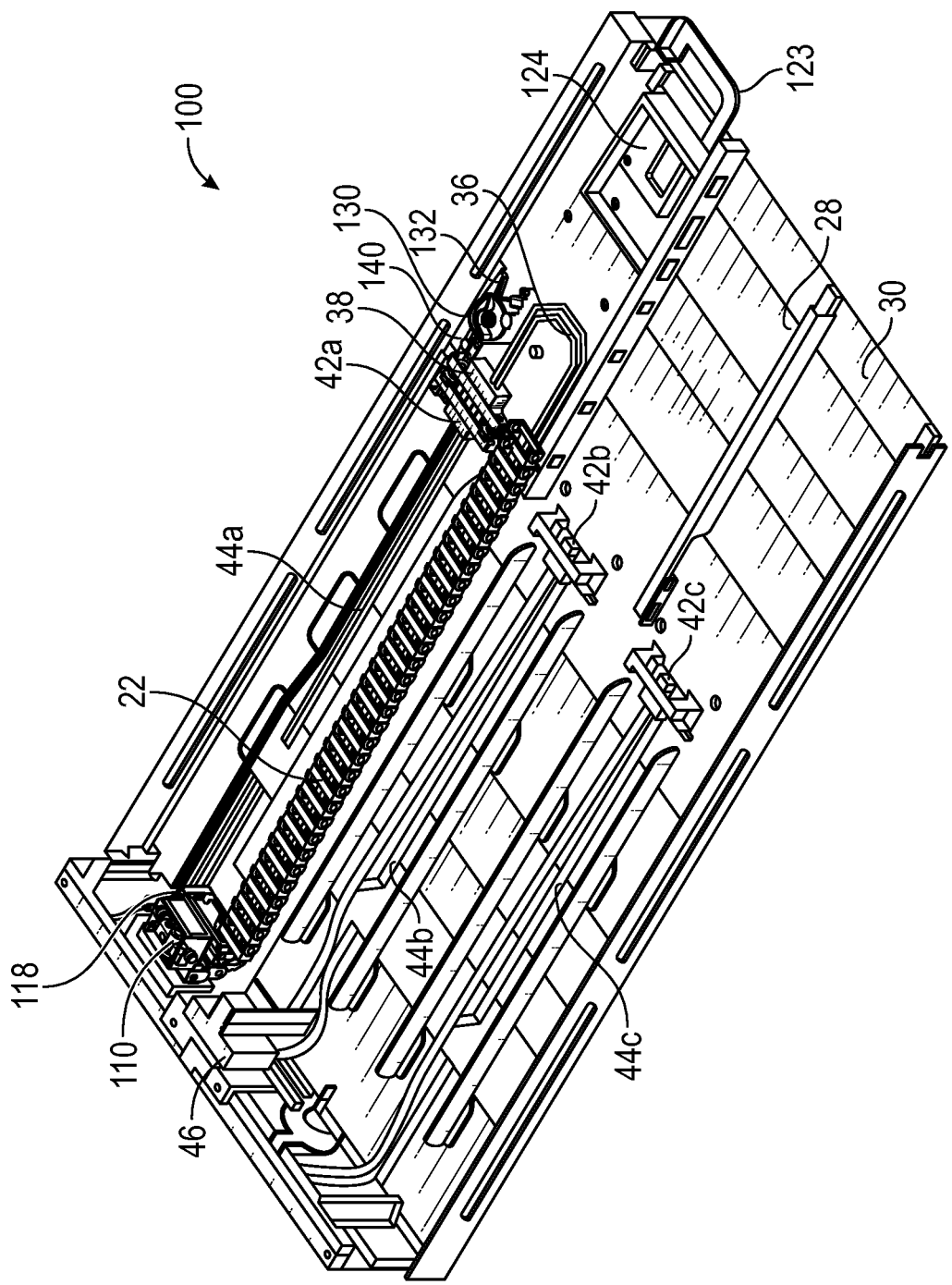
FIG. 5A is a top right front isometric view illustrating an embodiment of a latch mechanism enforcing a proper disconnect sequence.

FIG. 5A is a top right front isometric view illustrating an embodiment of a latch mechanism 100 enforcing a proper disconnect sequence. For convenience, FIG. 5A illustrates latch mechanism 100 in an installed and connected position, but without chassis 10 and its connectors 12a-12c and guide blocks 14a-14c. In FIG. 5A, latch mechanism 100 includes a spring loaded slider block 110 incorporated into guide section 34 (see FIG. 6B) of a back plane cable connector 118. Cable connector 118 is shown at the rear of PMDU power tray 24 next to rack power rail 46, which indicates chassis 10 (if it were shown) is in the installed position. Latch mechanism 100 also includes a trigger 130 including a trigger arm 132. In the installed and connected position of FIG. 5A, power is conveyed from a rack power rail 46 to PMDU 24, then through cabling 44a to PMDU power connector 42a. Power is similarly supplied to connectors 42b, 42c through cabling 44b, 44c, respectively. Tray connector 38 at a rear 140 of tray 124 is mated to PMDU connector 42a. Tray connector 38 conveys power to back plane cable connector 118 through cable 36 running within a cable chain 122. Power to connector 118 may be interrupted by pulling a handle 123 at the front of PMDU tray 124 to disengage connector 38 from connector 42a. Such movement of tray 124 does not disconnect backplane cable connector 118 and the motion of tray 124 relative to connector 118 is allowed by slack in cable chain 122.

Cable connector 118 includes a guide section 34 that cooperates with guide block 14a to line up a cable electrical connector 32 (connector 32 is shown in FIG. 4) with backplane electrical connector 12a. When connected to the backplane connector 12a, cable connector 118 is held connected by heads (52a, 52b (FIG. 6B)) of latch cylinders 20a, 20b being received within the notched slots (e.g., slot 16) of the guide block 14a. Latch cylinders 20a, 20b move within pin sleeves 21a, 21b (FIG. 6B), respectively. Cable chain 122 provides power through cabling 36 connected by a connector 38 located near edge 40 of PMDU tray 25. Connector 38 connects to a mating connector 42a of the PMDU 24. The connection between connector 38 and the PMDU power connector 42a and similar connections to connectors 42b, 42c are "blind mate" connections in that connector 118 is first connected to the backplane connector 12a, then chassis 10 with the three HDDs is installed in the rack above PMDU 24, which obscures the HDD backplane connections, and then connector 38 is "blind mate" connected to the PMDU power connector 42a by pushing tray 124 toward the PMDU connector 42a-without the user being able to see tray connector 38 or the PMDU connector 42a. In embodiments, latch cylinders 20a, 20b and heads 52a, 52b are shown to be cylindrical, however one of skill will realize that cylinders 20a. 20b may also have other geometries, such as being posts with square cross-sections, without departing from the teachings of this disclosure.

Figure 5B:
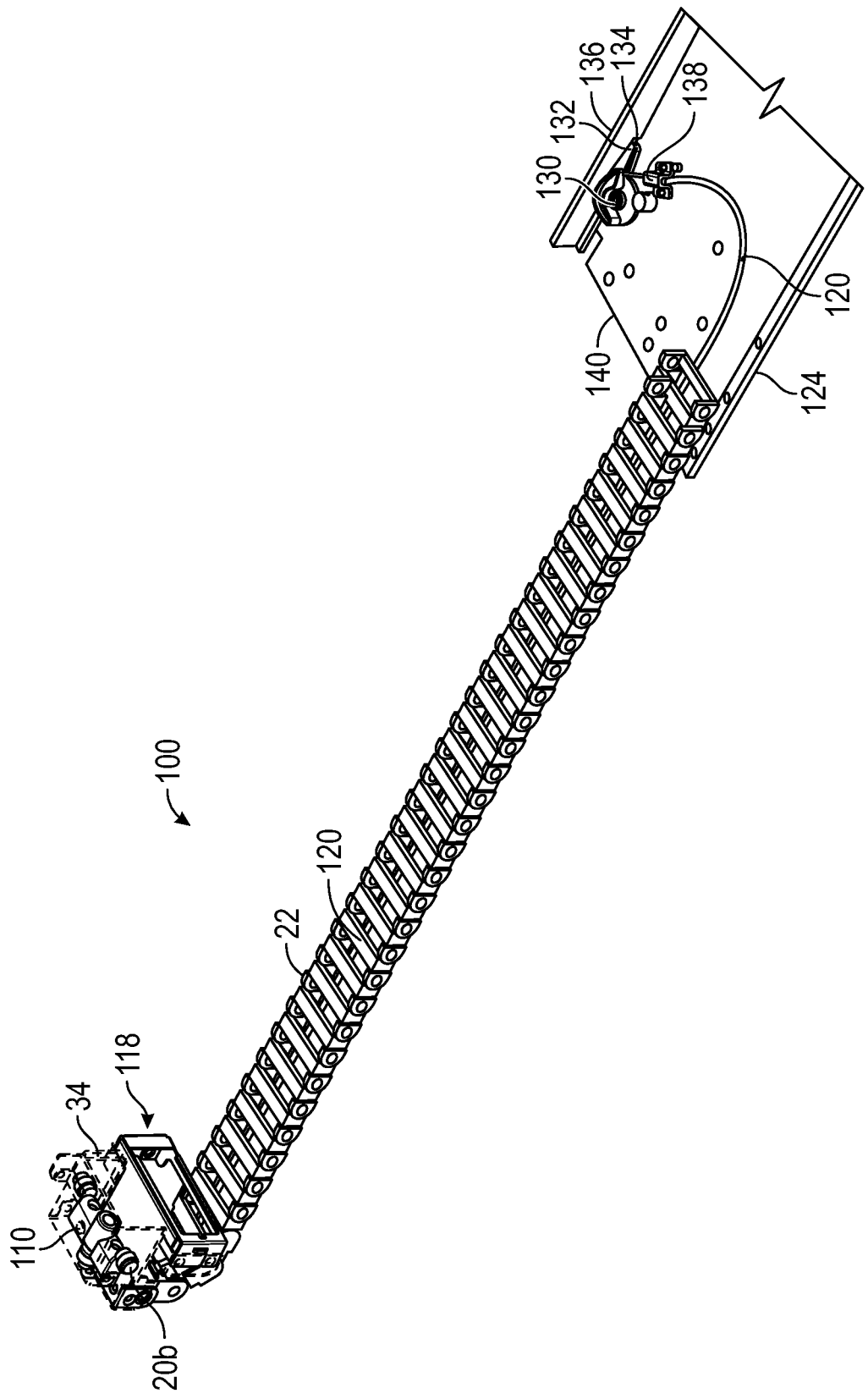
FIG. 5B is a top right front isometric view illustrating aspects of the embodiment of FIG. 5A.

FIG. 5B is a top right front isometric view illustrating aspects of latch mechanism 100. In FIG. 5B, cable chain 122 of latch mechanism 100 includes a clutch cable 120 with an internal wire 138. Wire 138 connects a trigger 130 to sliding block 110 within guide section 34 of cable connector 118. As shown in FIG. 5B, trigger 30 is in an untriggered state in which trigger arm 132 does not extend through a window 134 in a side 136 of tray 124. Also as shown in FIG. 5b, sliding block 110 is in a locking position in which sliding block 110 prevents latch cylinders 20a. 20b from being compressed into guide section 34. Trigger 130 is triggered when trigger arm 132 is moved so that it extends through window 134, explained further with regard to FIG. 6A. The counterclockwise rotation of trigger 130 draws wire 138 out from clutch cable 120. In turn, the drawing of wire 138 out of cable 120 draws slider block 110 back within guide block 34 until slider block 110 is no longer between latch cylinders 20a, 20b and no longer prevents latch cylinders 20a, 20b from being compressed. In this manner, the triggering of trigger 130 causes slider block 110 to unlock latch cylinders 20a, 20b, allowing them to be compressed. In the Figures, the electrical connectors, e.g., connectors 12a-12c, 32, 38, 42a-42c, are exemplary and any other suitable connector may be employed in embodiments.

Figure 6A:
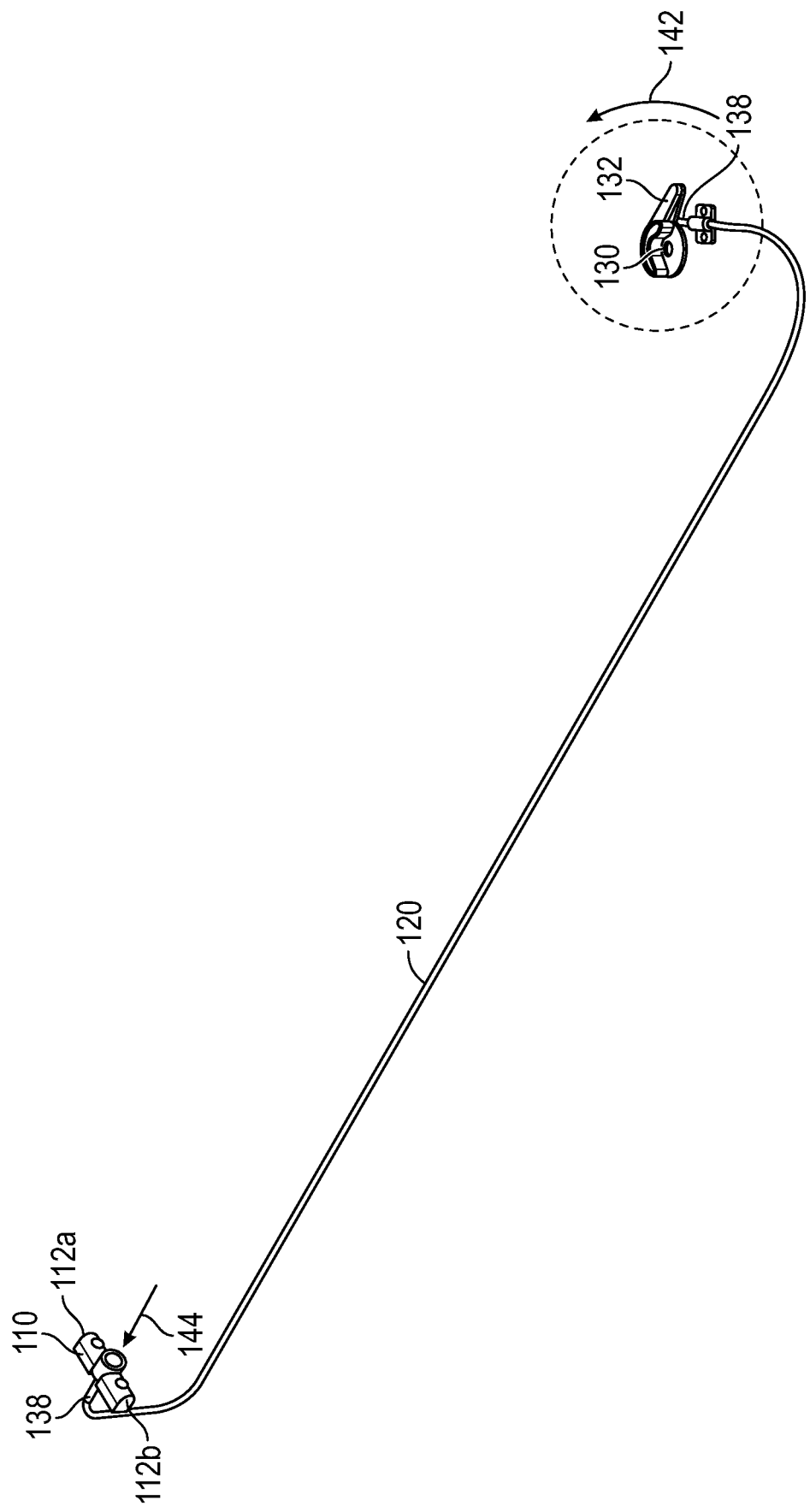
FIG. 6A is a top right front isometric view illustrating aspects of the embodiment of FIG. 5A.
Figure 6B:
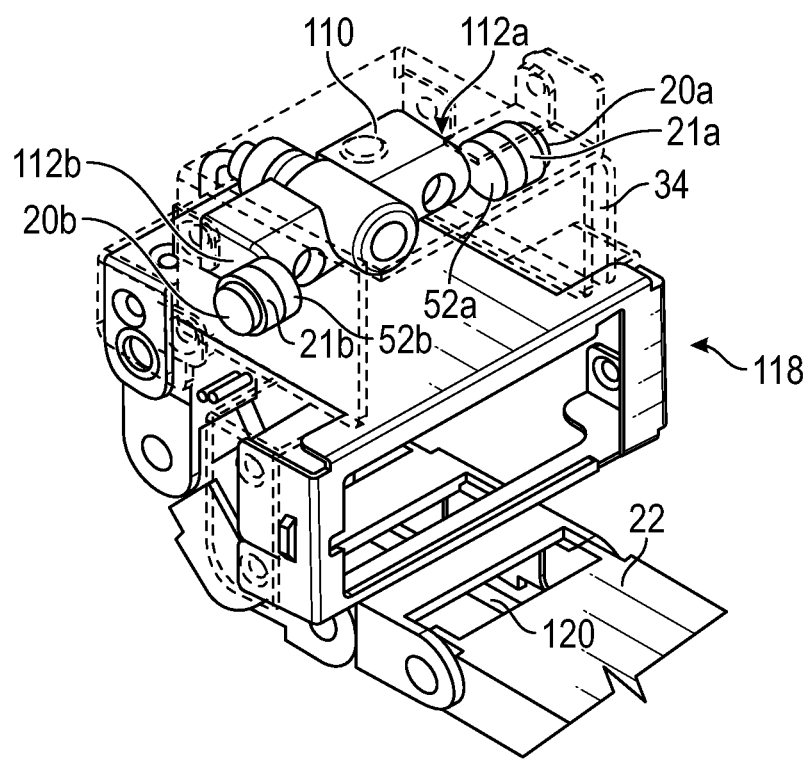
FIG. 6B is a top right front isometric view illustrating aspects of the embodiment of FIG. 5A.

FIG. 6A is a top right front isometric view illustrating aspects of latch mechanism 100. In FIG. 6A, counterclockwise rotation 142 of trigger 130 draws wire 138 out from clutch cable 120. In turn, the drawing of wire 138 out of cable 120 draws slider block 110 back 114 within guide block 34 until faces 112a, 112b of slider block 110 are no longer between latch cylinders 20a, 20b. Thus, latch cylinders 20a, 20b may be depressed. In this manner, the triggering of trigger 130 causes slider block 110 to unlock latch cylinders 20a, 20b, allowing them to be compressed and cable connector 118 disconnected from chassis 10. FIG. 6B is a top right front isometric view illustrating aspects of latch mechanism 100. In FIG. 6B, cable connector 118 is shown partially transparent to illustrate internal aspects. Sliding block 110 is depicted in the locking position in which faces 112a, 112b are disposed in front of latch cylinders 20a, 20b, preventing their movement into guide section 34. In this position, head 52a of guide cylinder 20a is retained within a slot 16a of guide block 14a. Similarly, head 52b of guide cylinder 20bg is retained within a slot 16b (FIG. 11A) of guide block 14a. By not allowing heads 52a, 52b to move inward, faces 112a, 112b maintain heads 52a, 52b within slots 16a, 16b, which prevents connector 118 from being disconnected.

Figure 7:
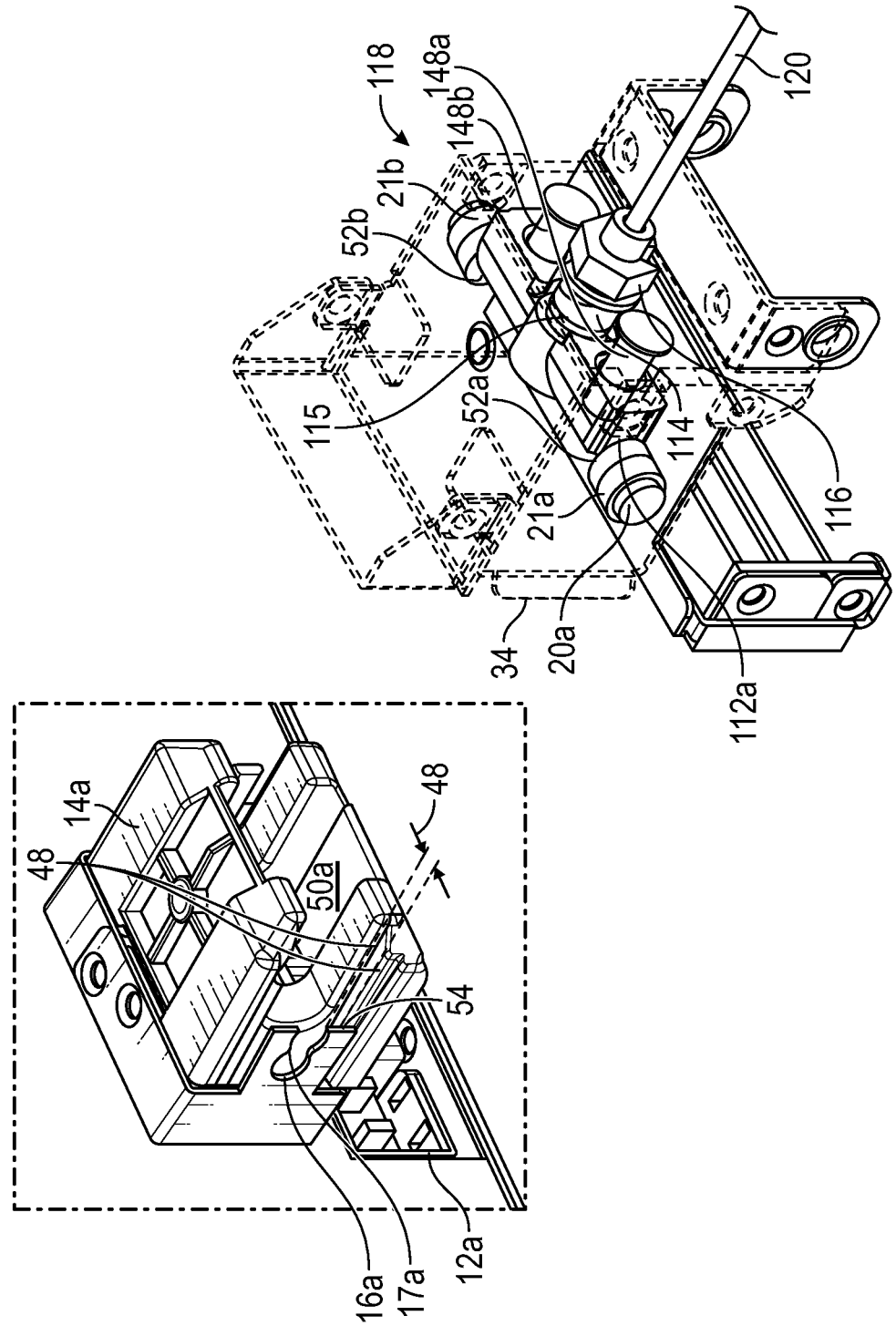
FIG. 7 is a top left rear isometric view illustrating aspects of the embodiment of FIG. 5A.

FIG. 7 is a top left rear isometric view illustrating aspects of latch mechanism 100. In FIG. 7, is shown partially transparent to illustrate internal aspects and sliding block 110 is in the locking position (as in FIG. 6B) with faces 112a, 112b blocking heads 52a, 52b from moving inward. Cable connector 118 and guide block 14a are symmetrical about a vertical plane and the following discussion applies equally to the left and right sides of cable connector 118 and guide block 14a, where relevant. FIG. 7 shows a spring 115 biasing sliding block 110 to the locked position between heads 52a, 52b. Spring 115 is about a slider guide 114 and is compressed between a slotted retaining nut 116 and sliding block 115. When sliding block 110 is pulled by wire 138 to the unlocked position, sliding block 110 moves over guide 114 and guide holes 150a, 150b move over guide posts 148a, 148b. The movement of sliding block 110 compresses spring 115 against nut 116. FIG. 7 illustrates that guide block 14a includes a face 50a that is a distance 48 inward from slot 16a, which is cut into a tab 54. Slot 16a includes a narrower neck 17a. Face 52a has a diameter that is dimensioned to be received by slots 16a and to be too large to pass through neck 17a. Thus, with face 52a received within slot 16a, cable connector 118 may not be disconnected from chassis connector 12a because face 52a may not pass through neck 17a. However, when sliding block 110 is in the unlocked position and latch cylinder 20a is depressed, the diameter of latch cylinder 20a is smaller than neck 17a. Thus, when latch cylinders 20a, 20b are depressed, heads 52a, 52b move inward and latch cylinders 20a, 20b may pass through necks 17a, 17b, allowing cable connector 118 to be disconnected from chassis connector 12a. The position of sliding block 110 with faces 112a, 112b between faces 52a, 52b is therefore a locking position. FIG. 7 further illustrates slots 70a, 70b, which receive sliding block 110 when the connection to connector 118 is made, and which are configured to allow the movement of block 110 between locked and unlocked positions while connector 118 remains latched.

Figure 8:
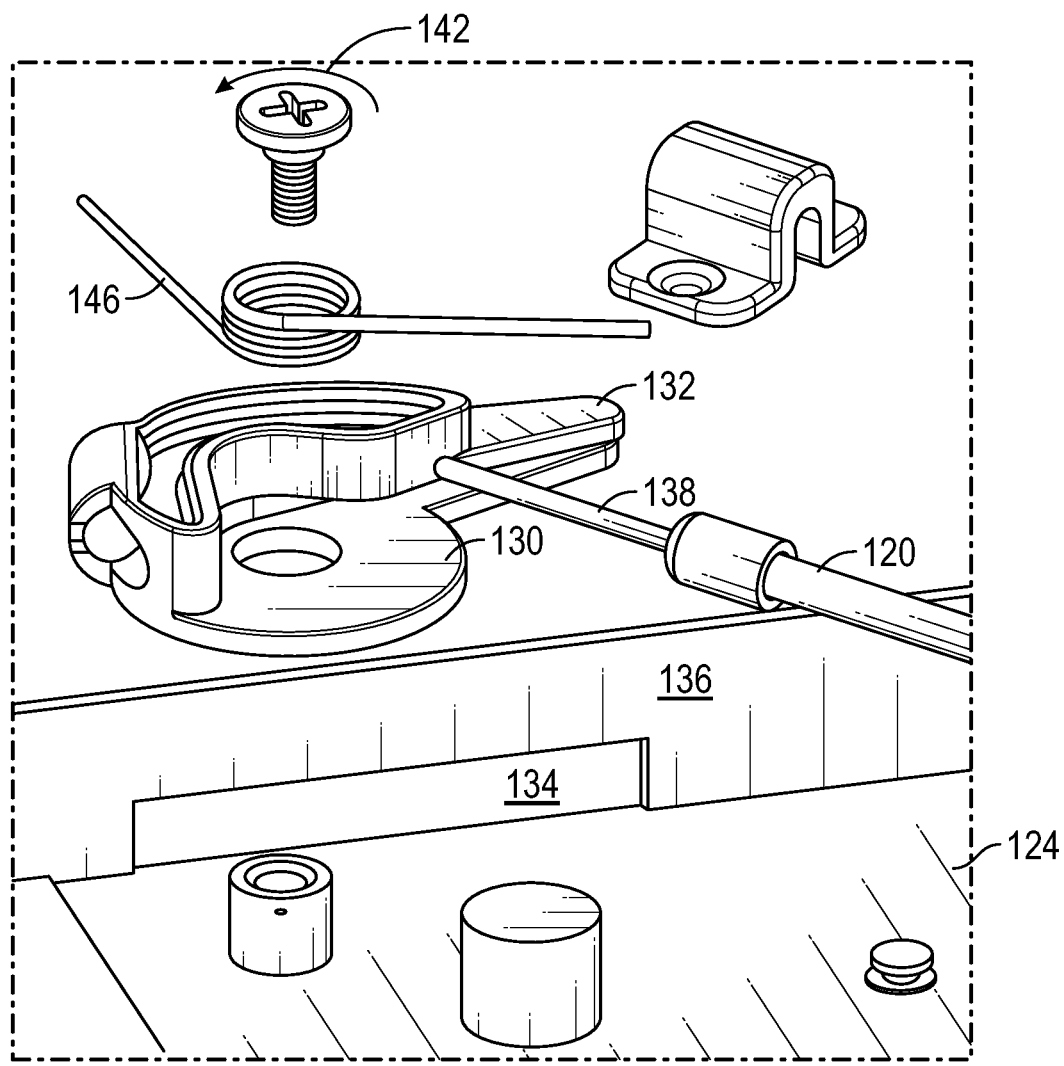
FIG. 8 is an assembly drawing illustrating aspects of the embodiment of FIG. 5A.

FIG. 8 is an assembly drawing illustrating aspects of latch mechanism 100. In FIG. 8, trigger 130 is shown to include a spring 146 that works against arm 132 in direction 142 to force arm 132 through window 134 in side 136 of tray 124. With movement in direction 142, trigger arm 132 draws wire 138 from clutch cable 120.

Figure 9:
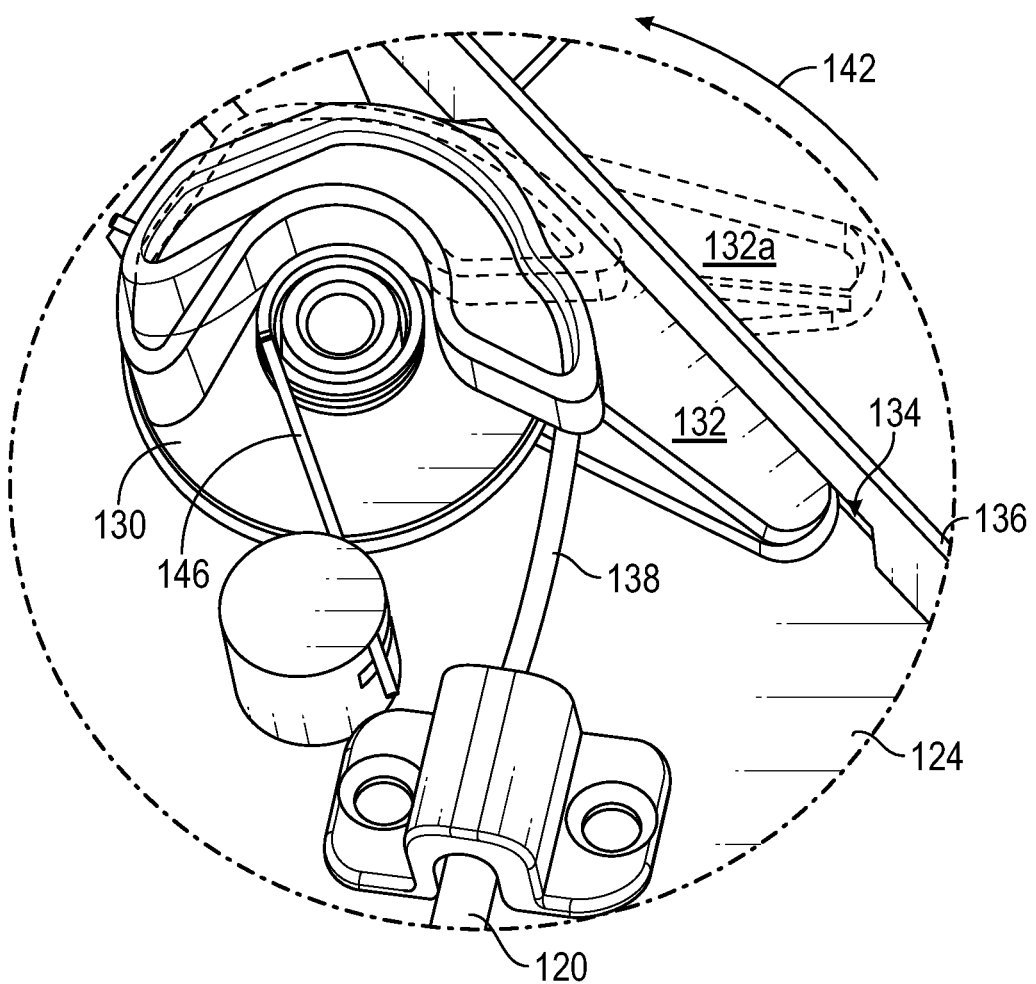
FIG. 9 is a top front isometric view illustrating aspects of the embodiment of FIG. 5A.

FIG. 9 is a top front isometric view illustrating aspects of FIG. 8. In FIG. 9, trigger arm 132 is shown to have an extended position 132a after being rotated in direction 142. Trigger arm 132 may rotate to extended position 132a provided window 134 is not blocked.

Figure 10:
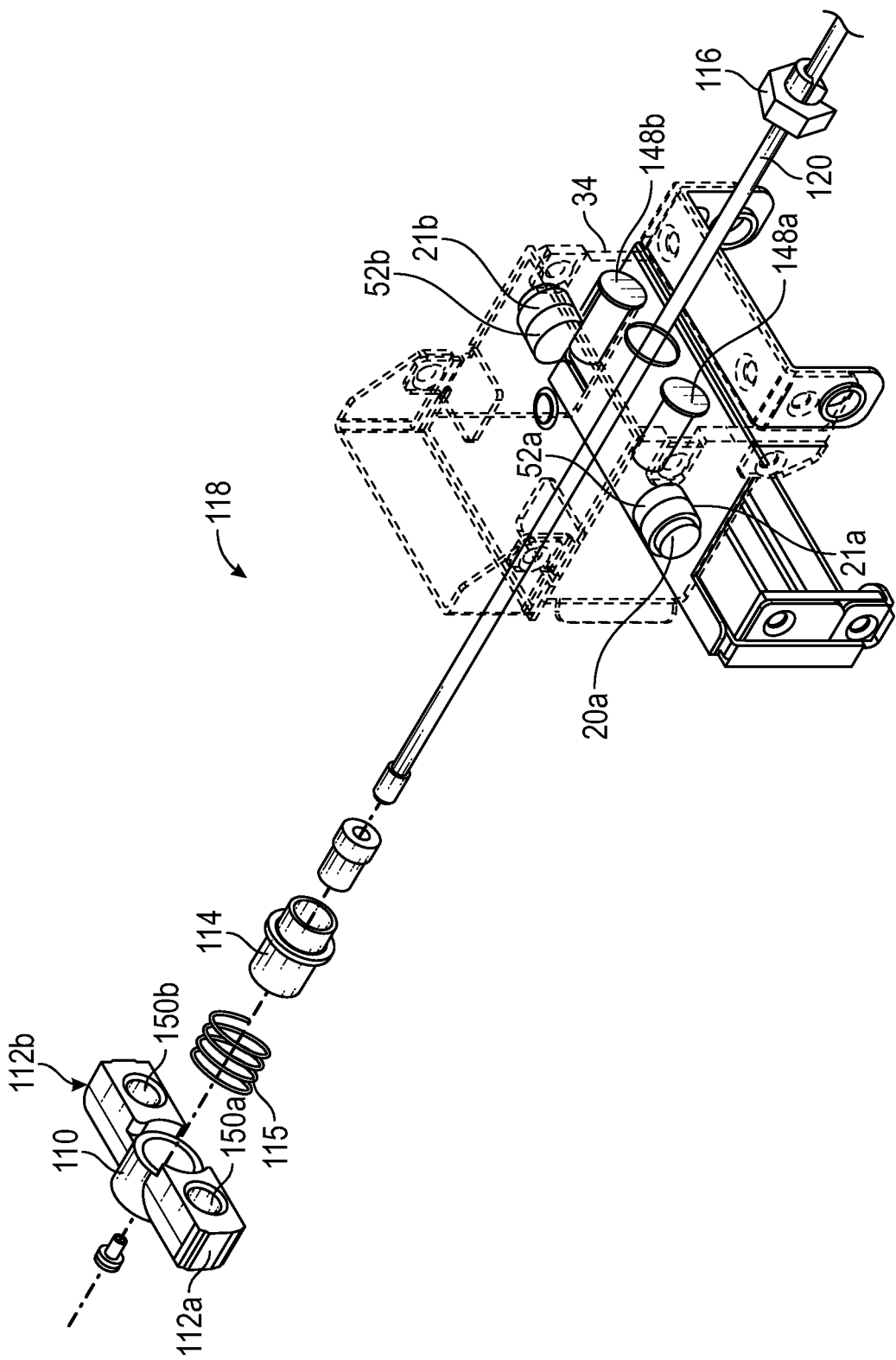
FIG. 10 is a top left rear isometric view illustrating aspects of the embodiment of FIG. 5A.

FIG. 10 is a top left rear isometric view illustrating aspects latch mechanism 100. In FIG. 10, sliding block 110 is shown in an assembly view that illustrates a screw 156 attached wire 138 to block 110. With slider guide 114 seated in guide section 34, cable 138 may draw slider 110 over guide 114 and posts 148a, 148b compressing spring 115.

Figure 11A:
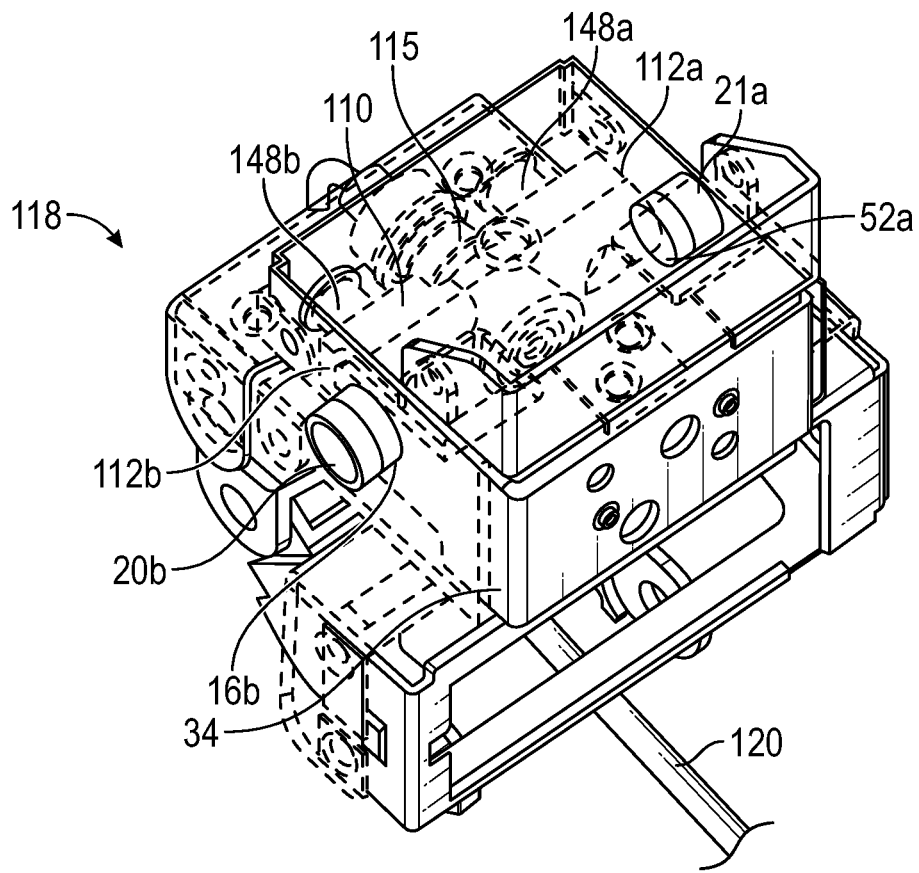
FIG. 11A is a top right front isometric view illustrating aspects of the embodiment of FIG. 5A in a connected state.
Figure 11B:
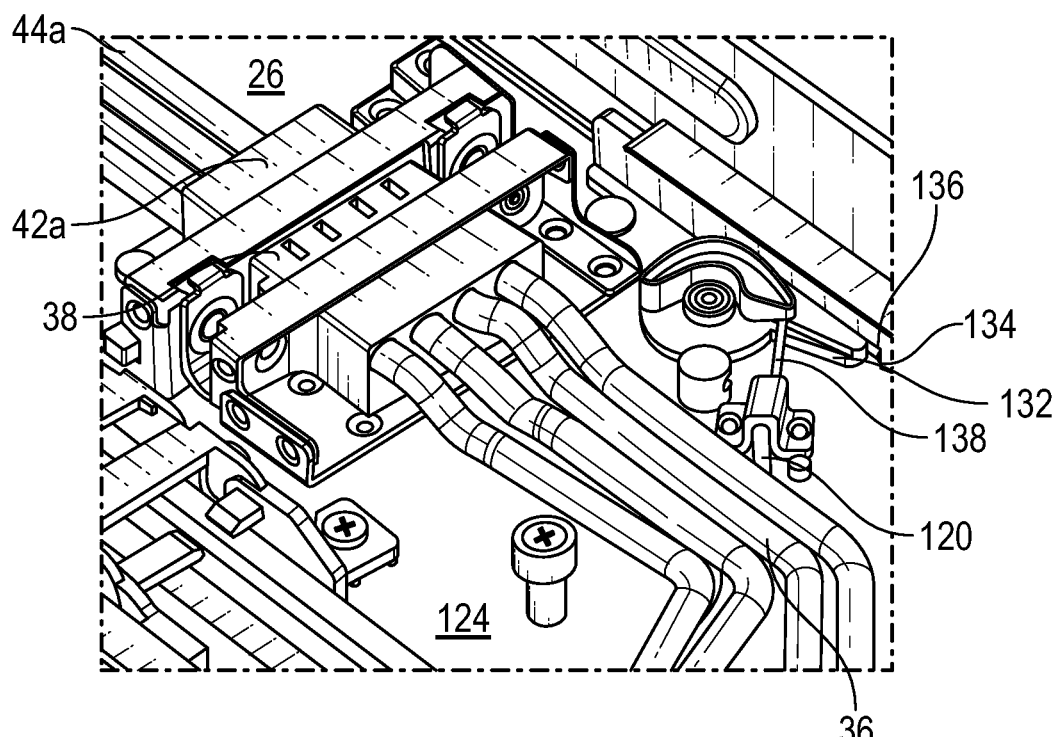
FIG. 11B is a top right front isometric view illustrating aspects of the embodiment of FIG. 5A in the connected state of FIG. 11A.
Figure 11C:
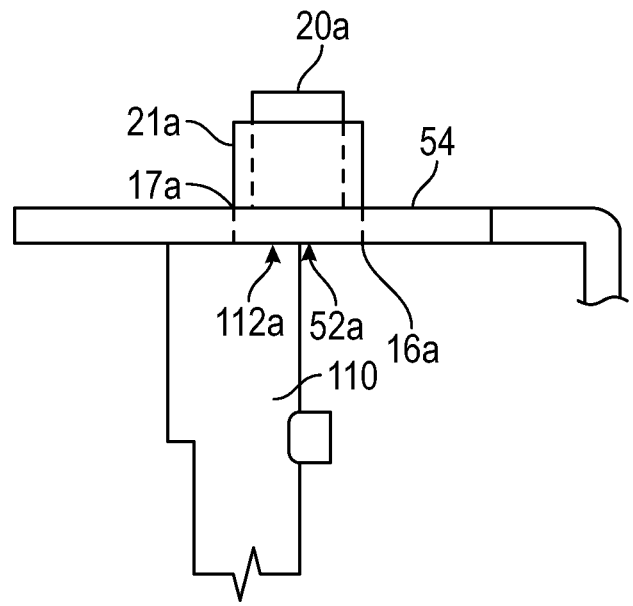
FIG. 11C is a top view illustrating details of FIG. 11A and FIG. 11B.

FIG. 11A is a top right front isometric view illustrating aspects of the embodiment of FIG. 5A in a connected state. In FIG. 11A, sliding block 110 is rendered partially transparent. FIG. 11B is a top right front isometric view illustrating aspects of the embodiment of FIG. 5A the connected state at the same time as FIG. 11A. FIG. 11C is a top view of a detail of FIG. 11A. In FIG. 11B, tray 124 has been fully inserted into PMDU 24, which causes connector 38 to engage connector 42a, providing power to cable 36. With tray 124 in this position, trigger arm 132 is prevented from extending through window 134 by a tray side 136 that is part of PMDU tray 26. Being part of PMDU tray 26, tray side 136 does not move relative to, e.g., connector 42a when tray 124 is withdrawn from PMDU tray 26. With trigger arm 132 in this "untriggered" position, FIG. 11A illustrates the corresponding position of sliding block 110 within guide section 34. Sliding block 110 is in a locking position in which faces 112a, 112b of sliding block 110 are in front of heads 52a, 52b, which prevents them from being compressed inward. Thus, being blocked by faces 112a. 112b from moving into guide section 34, heads 52a, 52b remain disposed within latch slots 16a, 16b. Since heads 52a, 52b are too large to pass through necks 17a, 17b, the position of sliding block in the locking position effectively prevents cable connector 118 from being disconnected from a chassis connector, e.g., connector 12a. Thus, when tray 124 is inserted and connectors 38 and 42a fully mated, cable connector 118 may not be disconnected from the chassis. FIG. 11C illustrates that in the connected state, head 52a of latch cylinder 20a is within slot 16a of tab 54 of guide section 34. Head 52a is prevented from moving out of slot 16a (to the left in the drawing) because head 52a is too large to pass through neck 17a (FIG. 7). Head 52a is prevented from moving out of slot 16a inward (downward in the drawing) because face 112a of sliding block 110 inhibits motion in that direction. Head 52b is similarly prevented from moving from slot 16b.

Figure 12A:
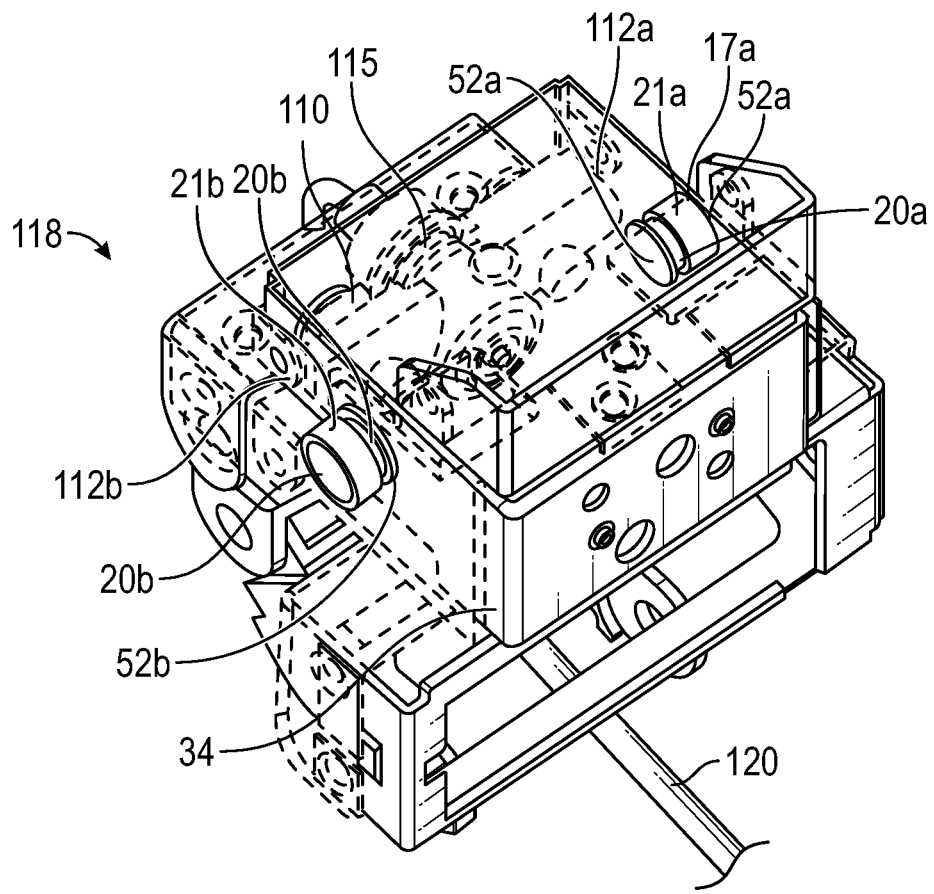
FIG. 12A is a top right front isometric view illustrating aspects of the embodiment of FIG. 5A in a partially disconnected state.
Figure 12B:
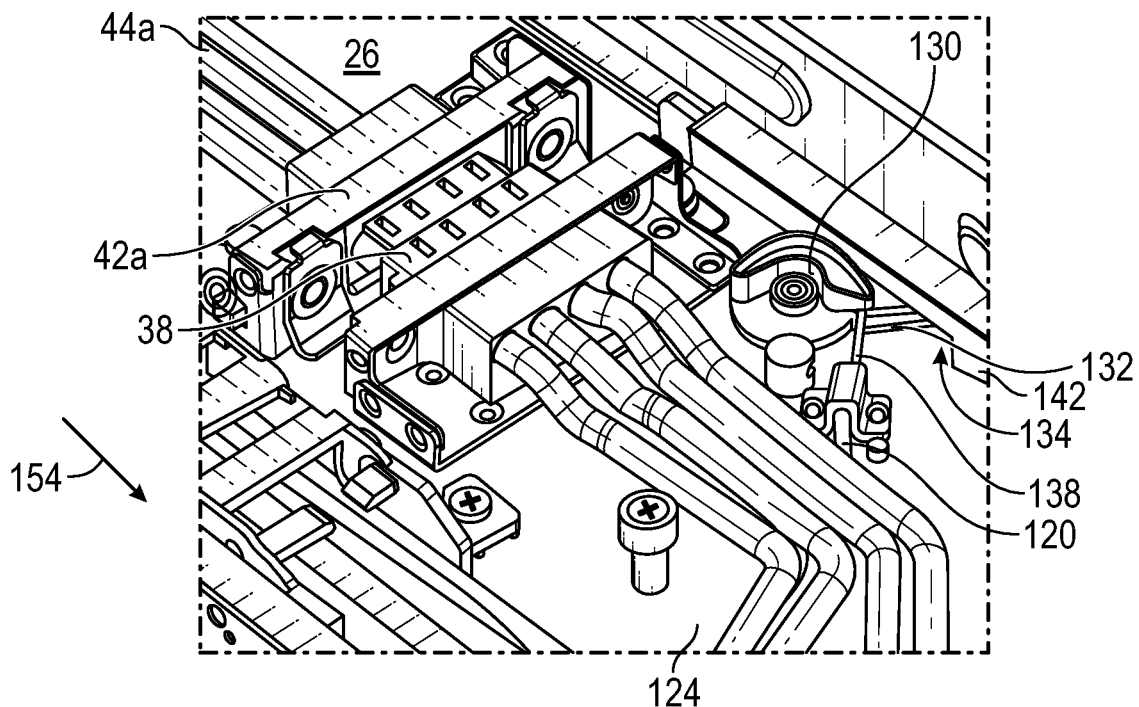
FIG. 12B is a top right front isometric view illustrating aspects of the embodiment of FIG. 5A in the partially disconnected state of FIG. 11A.
Figure 12C:
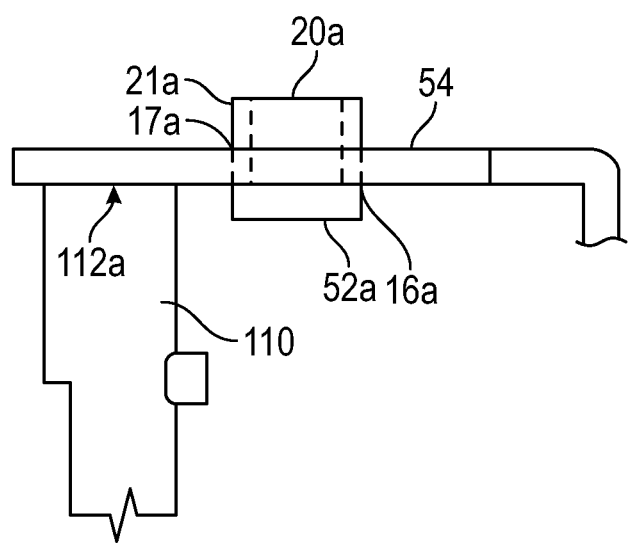
FIG. 12C is a top view illustrating details of FIG. 12A and FIG. 12B.

FIG. 12A is a top right front isometric view illustrating aspects of the embodiment of FIG. 5A in a partially disconnected state. In FIG. 12A, sliding block 110 is rendered partially transparent. FIG. 12B is a top right front isometric view illustrating aspects of the embodiment of FIG. 5A the partially disconnected state of FIG. 12A. FIG. 12C is a top view of a detail of FIG. 12A. In FIG. 12B, tray 124 has been partially withdrawn in direction 154 from PMDU tray 26, which causes connector 38 to dis-engage from connector 42a, interrupting power to cable 36. With tray 124 in this withdrawn, disconnected position, window 134 has moved past tray side 136, which allows trigger arm 132 to extend through window 134 and draw wire 138 from clutch cable 120. With trigger arm 132 in this "triggered" position, FIG. 12A illustrates the corresponding position of sliding block 110 within guide section 34. Sliding block 110 has been pulled by wire 138 (FIG. 6A) acting against spring 115 into an unlocked position in which faces 112a, 112b of sliding block 110 are no longer in front of heads 52a, 52b. Thus, latch cylinders 20a, 20b may be compressed to move heads 52a, 52b inward and no longer disposed within latch slots 16a, 16b. With latch cylinders 20a, 20b compressed, the smaller diameters of latch cylinder 20a, 20b that are now within latch slots 16a, 16b are small enough to pass through necks 17a, 17b of slots 16a. 16b. Connector 118 may now be disconnected from the chassis connector. FIG. 11C illustrates that in the disconnected state, head 52a of latch cylinder 20a may be pressed inward and out of slot 16a. Latch cylinder 20a is no longer prevented from moving out of slot 16a (to the left in the drawing) because latch cylinder 20a is small enough to pass through neck 17a (see also FIG. 7). Head 52a has been moved inward and out of slot 16a (downward in the drawing) after face 112a was pulled back by wire 138 so that face 112a no longer inhibited inward motion of head 52a.

Thus, as shown in FIG. 11A-FIG. 12C, it is only when tray 124 is in the withdrawn, disconnected position with connectors 38 and 42a separated and power to cable 36 interrupted, that cable connector 118 may be disconnected from the chassis connector, e.g., connector 12a. FIG. 11A-FIG. 12C illustrate how embodiments of latch mechanism 100 enforce a proper disconnect sequence in which power to the cable connector 118 and cable 36 must be interrupted by the disconnecting of PMDU connector 38 before cable connector 118 may be disconnected from the chassis.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   a first connector including:
      a release mechanism the actuation of which allows the disconnection of the first connector, and
      a sliding block movable between a first position in which the release mechanism is not actuatable and a second position in which the release mechanism is actuatable;
   a second connector moveable between a connected and a disconnected position;
   a trigger movable between a triggered and an untriggered position; and
   a cable connected between the trigger and the sliding block such that movement of the trigger is transferred to the sliding block, wherein:
   when the second connector is in the connected position and the sliding block is in the first position and the trigger is in the untriggered position, in response to movement of the second connector from the connected position to the disconnected position the trigger moves from the untriggered position to the triggered position, the movement of the trigger to the triggered position causing the cable to move the sliding block to the second position in which the release mechanism is actuatable.

2. The apparatus of claim 1, wherein:
   the release mechanism includes a first post including a first head, the first head configured to engage a first slot associated with a mating connector when the first head is in an unactuated position and configured to disengage the first slot when the first head is in an actuated position;
   movement of the first post in a first direction moves the first head to the actuated position; and
   the sliding block in the first position prevents movement of the first post in the first direction.

3. The apparatus of claim 1 further including a tray moveable within a chassis between an inserted position and a withdrawn position, wherein:
   the second connected is mounted to the tray;
   when the tray is in the inserted position the second connector is in the connected position;
   when the tray is in the withdrawn position the second connector is in the disconnected position;
   movement of the tray from the inserted position to the withdrawn position causes movement of the second connector from the connected position to the disconnected position and also causes the trigger to move from the untriggered position to the triggered position.

4. The apparatus of claim 3, wherein:
   the tray includes a window;
   the trigger includes a trigger arm biased by a first spring to extend through the window;
   when the tray is in the inserted position the chassis blocks the window and when the tray is in withdrawn position the chassis does not block the window;
   the trigger is in the triggered position when extended through the window and in the untriggered position when the window is blocked and the trigger is not extended through the window; and
   movement of the trigger to the triggered position pulls the cable causing the sliding block to move to the second position.

5. The apparatus of claim 4, wherein:
   a second spring biases the sliding block in the second position; and
   the first spring and the second spring are sized such that the first spring overcomes the second spring in moving the trigger to the triggered position.

6. The apparatus of claim 5, wherein:
   the release mechanism includes a second post including a second head, the second head configured to engage a second slot associated with the mating connector in an unactuated position and to disengage the second slot in an actuated position;
   movement of the second post in a second direction moves the second head to the actuated position; and
   the sliding block in the first position prevents movement of the second post in the second direction.

7. The apparatus of claim 6, wherein the first post and the second post are on either side of the release mechanism and when moving from the second position to the first position the sliding block moves between the first post and the second post.

8. The apparatus of claim 7, wherein the mating connector includes a third slot configured to accept the sliding block.

9. A method of ensuring a disconnection sequence, the method comprising:
   when: a second connector is in a connected position, and a sliding block is in a first position in which a release mechanism of a first connector is not actuatable, and a trigger is in an untriggered position, moving the second connector from the connected position to a disconnected position;

causing, by the movement of the second connector to the disconnected position, the trigger to move to a triggered position;
causing, by the movement of the trigger to the triggered position, a cable to move the sliding block to a second position in which the release mechanism is actuatable;
actuating the release mechanism; and
disconnecting the first connector.

10. The method of claim 9, wherein:
the release mechanism includes a first post including a first head, the first head configured to engage a first slot associated with a mating connector when the first head is in an unactuated position and configured to disengage the first slot when the first head is in an actuated position;
movement of the first post in a first direction moves the first head to the actuated position; and
the sliding block in the first position prevents movement of the first post in the first direction.

11. The method of claim 9, wherein:
the second connected is mounted to a tray;
when the tray is in an inserted position the second connector is in a connected position;
when the tray is in a withdrawn position the second connector is in a disconnected position; and
movement of the tray from the inserted position to the withdrawn position causes the movement of the second connector to the disconnected position and the trigger to move to a triggered position.

12. The method of claim 11, wherein:
the tray includes a window;
the trigger includes a trigger arm biased by a first spring to extend through the window;
when the tray is in the inserted position the chassis blocks the window and when the tray is in withdrawn position the chassis does not block the window;
the trigger is in the triggered position when extended through the window and in the untriggered position when the window is blocked and the trigger is not extended through the window; and
movement of the trigger to the triggered position pulls the cable causing the sliding block to move to the second position in which the release mechanism is actuatable.

13. The method of claim 12, wherein:
a second spring biases the sliding block in the second position; and
the first spring and the second spring are sized such that the first spring overcomes the second spring in moving the trigger to the triggered position.

14. The method of claim 13, wherein:
the release mechanism includes a second post including a second head, the second head configured to engage a second slot associated with the mating connector in an unactuated position and to disengage the second slot in an actuated position;
movement of the second post in a second direction moves the second head to the actuated position; and
the sliding block in the first position prevents movement of the second post in the second direction.

15. The method of claim 14, wherein the first post and the second post are on either side of the release mechanism and when moving from the second position to the first position the sliding block moves between the first post and the second post.

16. The method of claim 15, wherein the mating connector includes a third slot configured to accept the sliding block.

* * * * *